United States Patent

Kanishak et al.

[11] Patent Number: 6,086,711
[45] Date of Patent: Jul. 11, 2000

[54] VAPOR GENERATION SYSTEM AND PROCESS

[75] Inventors: Richard A. Kanishak, Danville; Kirk A. Martin, Aptos, both of Calif.

[73] Assignee: Nisene Technology Group, Santa Cruz, Calif.

[21] Appl. No.: 08/944,395

[22] Filed: Oct. 6, 1997

[51] Int. Cl.[7] .................................................. C23F 1/02
[52] U.S. Cl. .......................................... 156/345; 118/726
[58] Field of Search ............................. 438/706; 216/57, 216/58; 156/345; 118/726

[56] References Cited

U.S. PATENT DOCUMENTS

| | | | |
|---|---|---|---|
| 4,544,060 | 10/1985 | Enomoto | 198/495 |
| 5,078,922 | 1/1992 | Collins et al. | 261/139 |
| 5,190,064 | 3/1993 | Aigo | 134/84 |
| 5,203,925 | 4/1993 | Shibuya et al. | 118/726 |
| 5,204,314 | 4/1993 | Kirlin et al. | 505/447 |
| 5,413,671 | 5/1995 | Ketchum | 216/37 |
| 5,421,895 | 6/1995 | Tsubouchi et al. | 118/726 |
| 5,500,081 | 3/1996 | Bergman | 438/706 |
| 5,542,441 | 8/1996 | Mohindra et al. | 134/95.2 |
| 5,707,415 | 1/1998 | Cain | 65/379 |

Primary Examiner—Randy Gulakowski
Assistant Examiner—Shamim Ahmed
Attorney, Agent, or Firm—Skjerven, Morrill, MacPherson, Franklin & Friel, LLP; David E. Steuber

[57] ABSTRACT

A vapor generation system includes a supply of liquid; an inert gas stream; an aspirator for aspirating the liquid into the gas stream; a heater for heating the gas stream upstream from the aspirator to a temperature such that aspirated liquid is vaporized in the aspirator to form an inert gas and liquid vaporous mixture; and a mixture outlet for flowing the vaporous mixture against a surface of a workpiece. In a particular application a nitrogen gas stream is heated in a heat exchanger and flows through an aspirator/evaporator to vaporize pumped pulses of hydrofluoric acid in the heated flow stream. The resultant vaporous mixture forms a suitable vaporous etchant for removing silicon dioxide contaminates from a conveyor belt which is employed to convey semiconductor wafers through a chemical vapor deposition processing chamber.

16 Claims, 3 Drawing Sheets

VAPOR GENERATION SYSTEM AND PROCESS

RELATED APPLICATION

This application relates to U.S. application Ser. No. 08/757,495, filed Nov. 27, 1996 in our names, now U.S. Pat. No. 5,783,098 issued on Jul. 21, 1998, and which has an assignee common to the assignee of the subject application.

BACKGROUND OF THE INVENTION

1. Field of the Invention

The present invention relates to a vapor generation system and process utilizing an inert gas stream for aspirating a liquid and conveying a vaporous mixture to a processing unit. More particularly, the invention is directed to a vapor generation system using heating and aspiration for conveying a resultant vaporous mixture against a workspace, such as a conveyor metal surface having silicon dioxide ($SiO_2$) contamination thereon, so as remove such contamination.

2. Description of the Related Art

Contamination of semiconductor manufacturing equipment which convey semiconductor wafers into a processing chamber have continued to be a processing problem. In atmospheric-pressure chemical vapor deposition (APCVD) equipment, a transport conveyor, typically a stainless steel conveyor belt, conveys semiconductor wafers into and out of a APCVD chamber. Heretofore a so-called "muffle chamber" has been employed next to the APCVD chamber where a continuous-belt type conveyor is cleaned prior to receiving as-received wafers for additional APCVD processing. In a CVD process, performed either at atmospheric pressure or at a low pressure i.e., at a medium vacuum of 0.25–2.0 torr, at a temperature of 550–600° C., various deposits of $SiO_2$ are deposited, not only on the wafers as prescribed by the chip design, but also on the conveyor belt itself. As the $SiO_2$ deposits build up, $SiO_2$ particulates can flake-off the belt and cause contamination of the wafers in the CVD reaction chamber. $SiO_2$ is formed in the CVD reaction chamber typically by the reaction of a silane and excess oxygen by a heterogeneous surface reaction. Homogeneous gas gas-phase nucleation can occur leading to small white powdery $SiO_2$ particles on the chamber walls and on the conveyor belt, which can cause the particulate contamination in the deposited films on the wafers. Thus, improved apparatus for cleaning a continuous belt conveyor is desirable to eliminate this source of contamination.

SUMMARY OF THE INVENTION

According to the present invention, a module or system accurately disperses liquid hydrofluoric acid (HF acid) into a stream of heated nitrogen gas by means of a venturi-effect aspirator. Close control of the nitrogen temperature and flow rate is necessary to avoid any condensation or in having acid remaining in a liquid form which would result in liquid HF droplets in an exiting vaporous HF-$N_2$ stream. Typically, flows of about 1 ml of HF acid are mixed with about 30–40 liters of $N_2$ gas per minute to form a vaporous acid mixture with the $N_2$. The apparatus, due to HF acid pressurized plumbing must be suitably contained and employ corrosion-inert construction materials such as Teflon® components. Non-wetted components and any secondary containment may employ polypropylene or other standard construction materials. The $N_2$ must be pre-heated so that the thermal evaporation loss does not result in the immediate recondensation of the suspended aspirated HF acid. In one embodiment, a combination mix chamber and condensation trap is included to prevent any liquid droplets of HF, which might be formed from condensation or otherwise have not been vaporized, from exiting onto the continuous conveyor belt surface.

The invention also includes a means for monitoring actual vaporized HF acid delivery to a muffle chamber surrounding succeeding segments of the belt as the belt passes through the muffle chamber. This is done by a means for monitoring the difference in temperature between the aspirator inlet and outlet, i.e. the $N_2$ immediately upstream of the aspirator and the vaporized HF/$N_2$ mixture immediate downstream of the aspirator. Control is performed by monitoring and controlling a $N_2$ heat exchanger upstream of the aspirator. By also monitoring the aspirator outlet temperature, which is much lower (typically 30° C. to about 50° C. lower), due to evaporative thermal loss, the efficiency of the aspirator's liquid delivery can be directly monitored and used as a means of system calibration and fault detection. As the latent heat of the evaporated fluid is known, and the gas flow, the amount of acid vapor can easily be calculated to determine correct system operation. The invention provides precise automated etchant delivery utilizing an acid and N2 supply, corrosive media metering pump technology and microprocessor-controlled process automation with built-in operator safeguards and process controls. This results in a fully vaporized $N_2$-HF mixture without acid liquid droplets which otherwise likely would damage the belt by uneven etching. The vaporous mixture generated by the apparatus of this invention etches the belt uniformly in the muffle chamber.

In a preferred embodiment, the aspirator is augmented with an evaporator, with pulses of HF acid introduced from a micrometering pump to a capillary and venturi aspirator into the evaporator. Heated $N_2$ and the aspirated HF acid flow into a packed column of the evaporator to evaporate the liquid HF acid in the flow stream. The resultant vaporous mixture exits the evaporator directly to the belt etch muffle for cleaning the belt. The packed column typically is packed full and loosely with Teflon® shavings which absorb any small droplets of HF acid and presents an exceptionally large surface area for the $N_2$ to flow over and evaporate the HF acid so that the vaporized mixture is maintained up to saturation. The carrying capacity of the $N_2$ gas is increased by the heating of the $N_2$ in the heat exchanger. The carrying capacity is a function of the vapor pressure of the liquid at the operating temperature such as 50° C. The $N_2$ provided to the heat exchanger typically is at a pressure of from about 1 psi to about 2 psi and as the $N_2$ expands and cools it has less and less capacity to carry the evaporated HF acid at an acceptable vapor pressure of the HF acid.

A vapor generation system includes a liquid supply; an inert gas stream; an aspirator for aspirating liquid into the gas stream; a heater for heating the gas stream upstream from the aspirator to a temperature such that aspirated liquid is vaporized in the aspirator to form a vaporous mixture; and a mixture outlet for flowing the vaporous mixture against a surface of a workpiece to etch or otherwise provide a source of vaporized process fluid to contact a workpiece surface.

DETAILED DESCRIPTION

Figure 1:
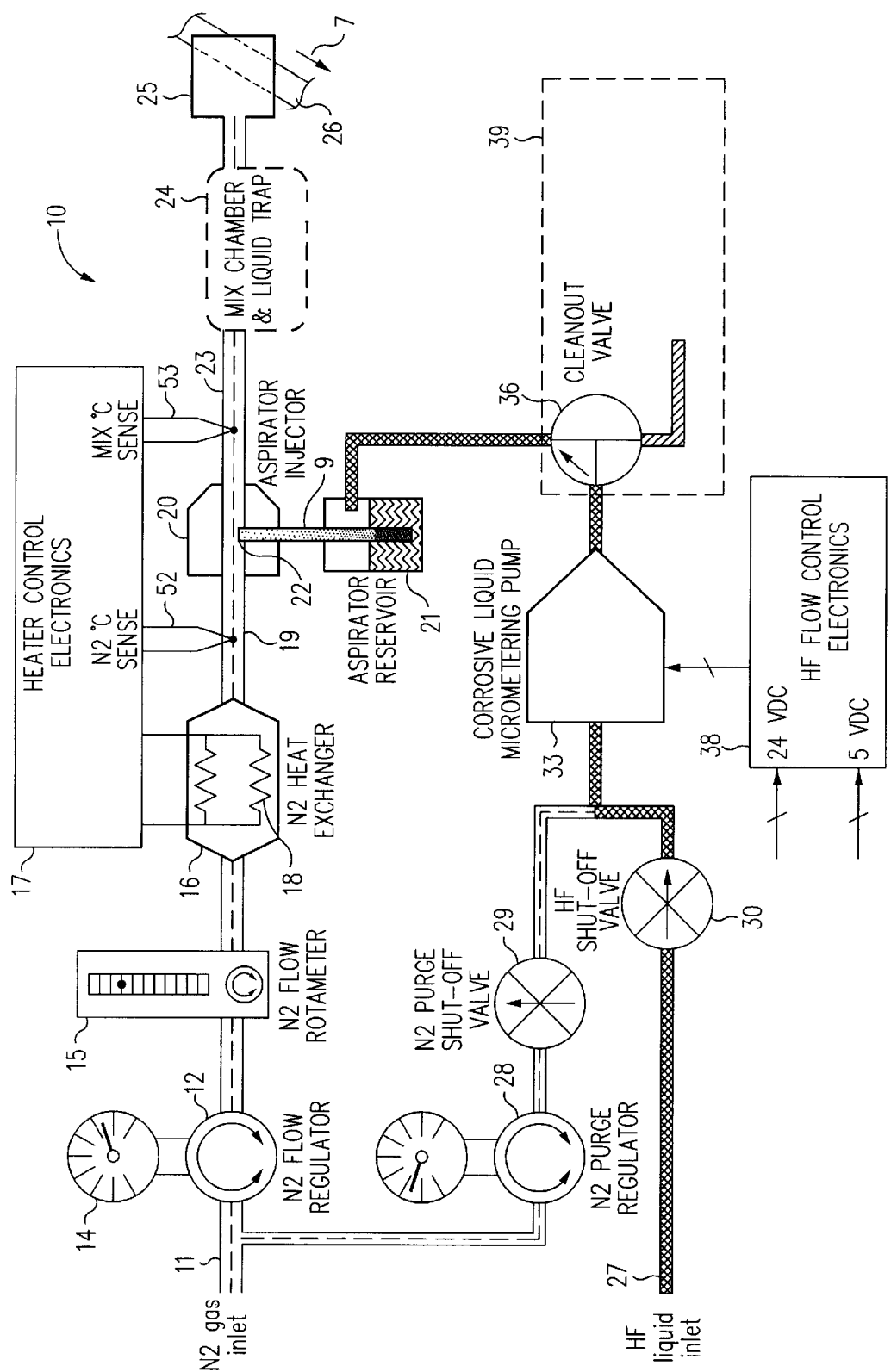
FIG. 1 is a schematic view of the vapor generation system of the invention employing an aspirator reservoir.

The following description is the contemplated best mode of the invention. In the drawings, like numbers and legends, are used to designate the same parts in the various embodiments.

FIG. 1 shows a vapor generation system 10, particularly useful for the etch removal of contaminants such as silicon dioxide from the surface of a continuous belt-type conveyor, which conveyor is utilized to convey semiconductor (e.g., silicon) wafers into a CVD chamber for wafer processing. An inert gas stream, typically nitrogen gas, is introduced in an N$_2$ gas inlet 11, the flow of which is regulated by a flow regulator 12 having a visual read-out 14. A standard pressure regulator may be used. A standard rotameter 15 functions as a read out of the N$_2$ flow rate and a needle valve (not shown) allows flow control. The N$_2$ gas stream is heated in an N$_2$ heat exchanger 16 containing resistance heating coils 18 so that the gas stream is heated to a range of from about 50° C. to about 100° C. A resultant preferred N$_2$ temperature is about 100° C. A 115/230 volt AC power source provides the current to heat the coils 18. Typically, the regulated N$_2$ pressure is about 15 psi and the flow rate is from about 30 to about 40 liters per minute.

Concurrently, a supply of liquid etchant, typically 49% hydrogen fluoride and 51% H$_2$O, i.e., hydrofluoric acid a typical etchant for the above described SiO$_2$ contaminants removal from the conveyor belt, typically made up of stainless steel segments, is introduced into HF acid inlet 27 and flows through HF acid shut-off valve 30. The acid should be prefiltered to remove particulates. The arrows on this and other valves indicate the valve positions under normal operating conditions. The dashed flow lines indicate N$_2$ flow while the heavy shaded lines indicate HF acid flow. A liquid micrometering pump 33 of the type set forth, such as in FIG. 8 of the related application suitable for the corrosive acid liquid environment may be employed. Typically, this pump will pump 350$\mu$ liter pulses at from 1–5 times per second. Normally, the acid directly flows through cleanout purge valve 36 to aspirator reservoir 21. The cleanout valve may be rotated so as to either supply liquid acid for removing contaminants from the muffle chamber walls directly or for disposal of residual fluids from the pump 33 during shut down. The aspirator reservoir may have a volume of about 1–5 ml. A capillary tube 9 extends into the HF acid in the reservoir 21 and upwardly forming an aspirator tip 22 at a junction with a heated inert gas stream of N$_2$ flowing horizontally through aspirator 20. The flow of the liquid from the resevoir is controlled by the length and inside diameter of tube 9. The flowing N$_2$ aspirates HF acid into the flowing heated gas stream. The temperature, typically 100° C., and the flow of liquid into the aspirator is sufficient to form a fully vaporous mixture of the heated N$_2$ stream and the vaporized (evaporated) HF etchant. The N$_2$ stream flow and heating is monitored so that the vaporous mixture approaches but does not exceed saturation of vaporized acid in the N$_2$. The system 10 may include an additional downstream mix chamber and liquid trap 24, shown in dash lines, to remove any undesirable fine droplets of liquid acid in the flowing stream of N$_2$ and vaporized HF. As illustrated, the vaporous mixture flows through flow line 23 into a muffle chamber 25 through which a conveyor belt 26 passes (arrow 7), where succeeding sequential segments of the belt length are etched so as to remove SiO$_2$ contaminants resulting from CVD processing of semiconductor wafers, which had been moved through the CVD apparatus (not shown) and subsequently removed from the conveyor before the conveyor passes back through the muffle chamber.

Monitoring and control of the heating of the N$_2$ gas is provided by a N$_2$ temperature sensor 52 positioned immediately upstream of the aspirator 20 and a vaporous mixture temperature sensor 53 downstream of the aspirator 20. Heating control electronics 17 and acid control electronics 38 are typically combined into a single microprocessor based control system of conventional design. The microprocessor may be a local processor, such as a PIC 16C55 processor available from Microchip Technologies of Chandler, Ariz.

Figure 2:
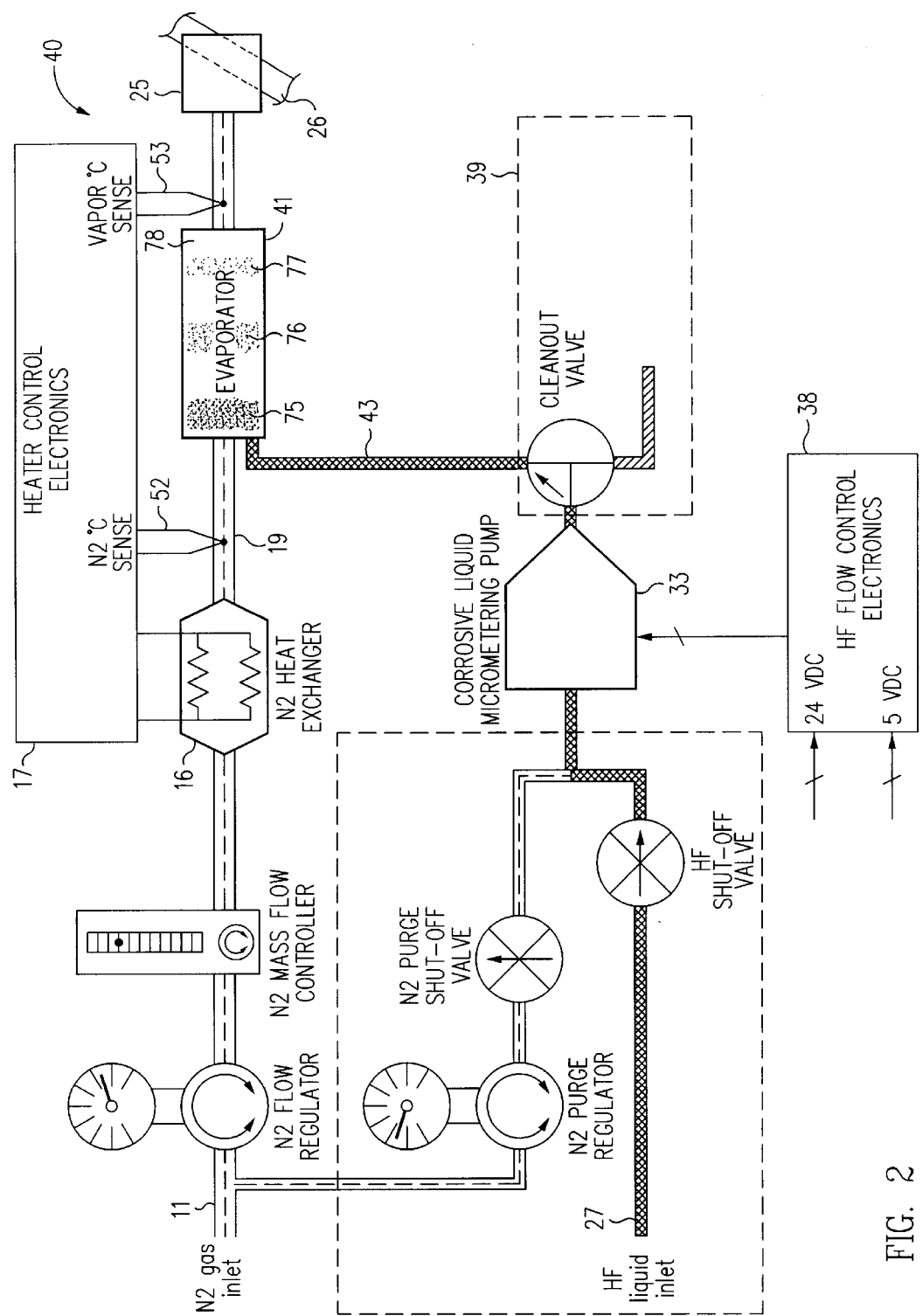
FIG. 2 is a schematic view of a second embodiment of the vapor generation system employing an aspirator and evaporator.
Figure 3:
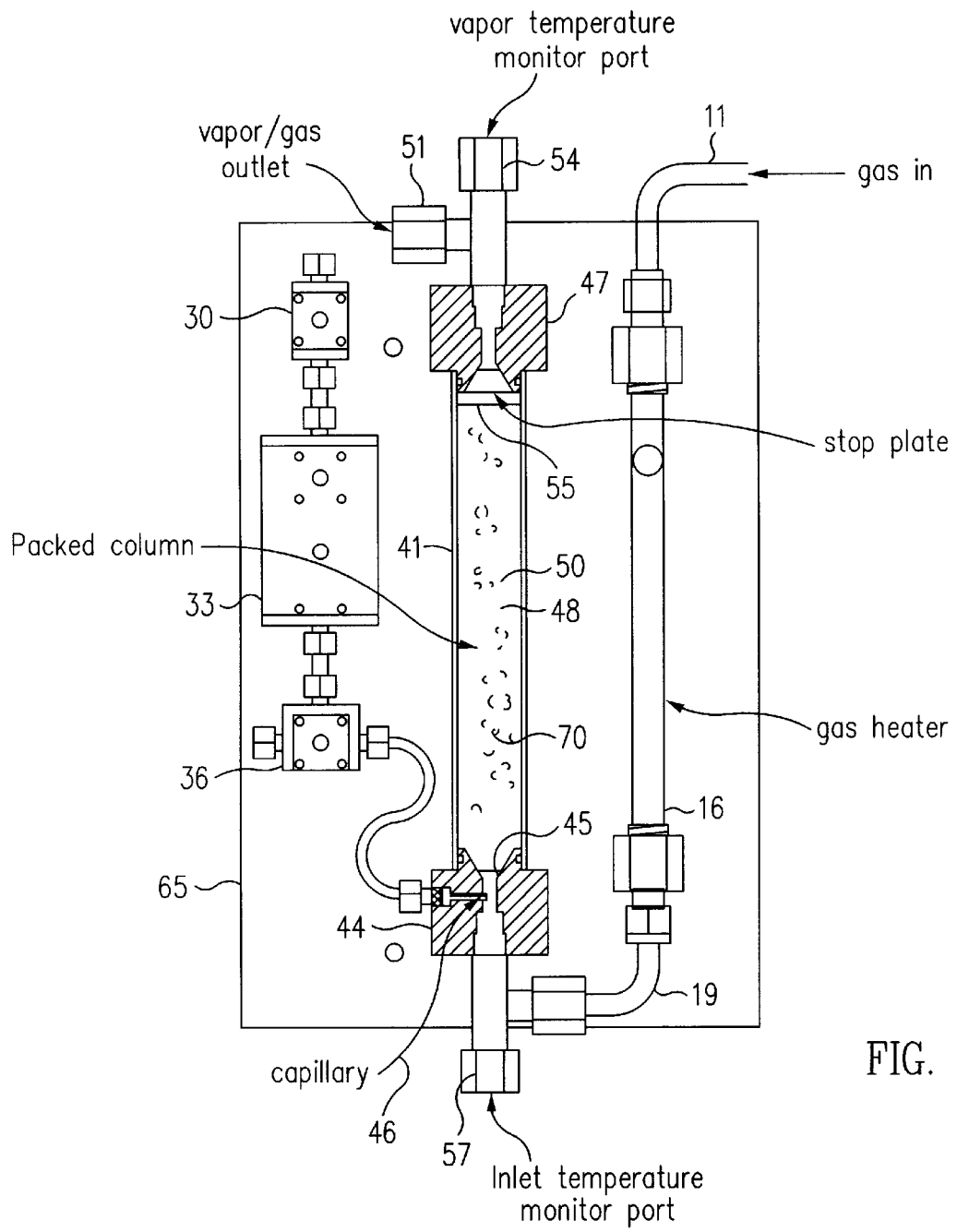
FIG. 3 is a side view partially in section of a contained assembly of a N$_2$ heater, an acid pump and venturi, a aspirator/packed evaporator and monitoring ports as shown in FIG. 2.
Figure 4:
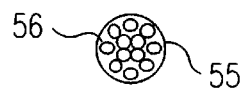
FIG. 4 is a plan view of the stop plate in the packed evaporator.

The FIGS. 2–4 embodiment of system 40 generally is the same as the FIG. 1 embodiment except that the pump 33 feeds the etchant directly to an aspirator/evaporator 41 rather than to a reservoir. The evaporator is positioned in the heated gas flow line 19 between the N$_2$ heat exchanger 16 and the muffle chamber 25. Aspirated HF is progressively evaporated in the evaporator by the heated flowing N$_2$ gas stream. This is shown schematically in FIG. 2 where a multiplicity of HF liquid droplets 75 are in an evaporator column next to the aspirator tip position while a lesser multiplicity of droplete 76 are immediately downstream, a still lesser multiplicity of droplets 77 are further downstream in the evaporator and finally, due the aforementioned monitoring and control of the N$_2$ temperature and the N$_2$ and acid and HF flow rates, all the liquid HF droplets have been effectively vaporized at the downstream end volume 78 of the evaporator, and a vaporous mixture of N$_2$ and HF exits to the muffle chamber 25 to etch moving belt 26.

FIG. 3 illustrates a complete system will all mechanical components mounted to a polypropylene plate 65. This assembly includes HF acid valves and pump 33, the N2 heater/heat exchanger 16 and an evaporator 41 in the form of a packed column 50. The column 50 includes a first end 44 containing an interior flow venturi 45, a HF acid inlet capillary 46 and a bottom port receiving heated N$_2$ through flow line 19 from heater 16. The heated flow stream passing into end 44, past the open capillary and the discharging pulses of HF acid and the venturi and its downstream expansion nozzle starts the evaporation and vaporization of the HF acid. The interior volume 48 of the column 50 is loosely but fully packed preferably with a packing of Teflon® (polytetrafluoroethylene) plastic spiral shavings 70 of a size about 1 mm by 0.01 mm in cross section and up to 80 mm long. The loose shavings are confined in the volume 48 by a stop plate 55 adjacent to column end 47. A venturi-like bore is in end 47 which increases the velocity and carrying capacity of the mixture to prevent or reduce downstream condensation. "Loose" as used herein means that the shavings are not rammed into the column but are loose enough not to pose a N$_2$ flow resistance and a resultant back pressure problem and a resultant lessening of the aspiration of the HF acid into the column. The monitoring electronics 17 and 38 controls precisely how much the HF fluid has been evaporated into the N$_2$ stream and will also sense if there is any interruption of the acid flow. If there is no evaporation of HF acid, the temperature at sensor 53 (FIG. 2) will go up rather dramatically which would indicate an interruption of HF acid flow service as a feedback. As a test, at a 41 liters per minute flow rate of N$_2$ gas with the N$_2$ then heated to 60° C., a flow of liquid (H₂O) of 0.5 milliliter per minute into the heated stream resulted in a 20° C. to 25° C. consistent temperature drop due to the heat of vaporization of the fluid. An $N_2$ gas inlet monitor port 57 allows entry of sensor 52 (FIG. 2). A gaseous $N_2$ and HF acid vaporized mixture monitor port 54 allows entry of sensor 53. A flow line for the gaseous mixture to the muffle chamber is connected to port 51. Flow of acid to the capillary 46 is through the aforementioned valve 30, pump 33 and cleanout valve 36, all mounted on plate 65. FIG. 4 illustrates the stop plate which contains apertures 56 of a size about 2 mm in diameter to allow passage of the vaporized mixture, while preventing egress of the Teflon shavings.

In other semiconductor processing steps, it is required that a vaporous solution be supplied. Thus, the apparatus of this invention has utility other than for removal of $SiO_2$ deposits on a conveyor belt. For example, the system can be used for vapor deposition in APCVD systems. The above description of embodiments of this invention is intended to be illustrative and not limiting. Other embodiments of this invention will be obvious to those skilled in the art in view of the above disclosure.

We claim:

1. A vapor generation system comprising:
   a supply of liquid;
   an inert gas stream;
   an aspirator for aspirating the liquid into the gas stream;
   a heater for heating the gas stream upstream from the aspirator to a temperature such that aspirated liquid is vaporized in the aspirator to form an inert gas and liquid vaporous mixture; and
   a mixture outlet for flowing the vaporous mixture against a surface of a workpiece.

2. The system of claim 1 in which the liquid is hydrofluoric acid.

3. The system of claim 1 in which the inert gas stream is a nitrogen gas stream.

4. The system of claim 1 further including an aspirator reservoir; a pump for pumping liquid to the reservoir; an aspirator tip; and an aspirator tube extending from the reservoir to the aspirator tip.

5. The system of claim 1 further including an aspirator tip, an evaporator juxtaposed to the aspirator tip for progressive evaporation of the liquid to a vapor form as the heated gas stream passes through the evaporator.

6. The system of claim 5 wherein the evaporator comprises a packed column.

7. The system of claim 6 wherein the column is packed with polytetrafluoroethylene shavings.

8. The system of claim 7 further including a multi-apertured stop plate at an exit end of the column to prevent egress of the shavings from the column.

9. The system of claim 5 wherein the aspirator includes a capillary and an associated venturi for aspirating the liquid into the heated gas stream.

10. The system of claim 1 further including a muffle chamber and wherein the workpiece is a stainless steel continuous conveyor belt passing through the muffle chamber.

11. The system of claim 10 in which a surface of the conveyor belt is contaminated with a silicon dioxide particles and the liquid is a hydrofluoric acid etchant which etches and removes the silicon dioxide particles from the conveyor belt surface.

12. The system of claim 1 wherein said heater is a heat exchanger upstream of said aspirator.

13. The system of claim 12 further including a first temperature sensor in a first flow line between said heat exchanger and said aspirator for sensing the temperature of the heated gas and a second temperature sensor in a second flow line downstream of said aspirator such that the amount of liquid evaporated into the heated gas stream is determinable.

14. The system of claim 1 further including a clean-out regulator, a cleanout valve and a liquid supply valve, said supply valve being closable to stop liquid flow and said cleanout valve being operable to clean out the system.

15. The system of claim 1 further including a metering pump for pumping the liquid to said aspirator.

16. The system of claim 1 further comprising a gas flow meter upstream from said aspirator, a first temperature sensor in said inert gas stream upstream from said aspirator, a second temperature sensor in said vaporous mixture downstream from said aspirator, and control electronics for determining the amount of evaporator of said liquid from the output of said flow meter, said first temperature sensor, and said second temperature sensor.

* * * * *